United States Patent
Johnson et al.

(10) Patent No.: US 6,469,530 B1
(45) Date of Patent: Oct. 22, 2002

(54) METHOD AND APPARATUS FOR TESTING OF BALL GRID ARRAY CIRCUITRY

(75) Inventors: Samuel Alan Johnson, Eagle; Mukesh P. Patel; Timothy V. Harper, both of Boise, all of ID (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/504,158

(22) Filed: Feb. 15, 2000

(51) Int. Cl.$^7$ .............................................. G01R 31/02
(52) U.S. Cl. ...................................................... 324/754
(58) Field of Search .......................... 324/754; 439/91, 439/65

(56) References Cited

U.S. PATENT DOCUMENTS

| | | | |
|---|---|---|---|
| 5,334,857 A | 8/1994 | Mennitt et al. ................ | 257/48 |
| 5,378,981 A | 1/1995 | Higgins, III ................. | 324/765 |
| 6,050,832 A | * 4/2000 | Lee et al. ..................... | 439/91 |
| 6,093,476 A | * 7/2000 | Horiuchi et al. ............. | 428/209 |

OTHER PUBLICATIONS

U.S. patent No. 6,034,426,Issue Date Mar. 7, 2000 Title: Universal Testable Low Inductance Integrated Circuit Package; Inventor(s): Mukesh P. Patel and Amit Agrawal.

* cited by examiner

*Primary Examiner*—N. Le
*Assistant Examiner*—Etienne P LeRoux

(57) ABSTRACT

A ball grid technology circuit assembly for mounting and connecting a ball grid array circuit package having a grid array of ball pads to a printed circuit board and providing enhanced connections for testing of the ball grid array circuits. The printed circuit board includes a via array of vias wherein each via extends from the upper face of the printed circuit board to a lower face of the printed circuit board and is co-located with a ball pad of the ball grid array to provide a path between the ball pad and the lower end of the via to provide electrical access to the corresponding ball pad. A probe array includes a pin array of probe pins wherein each probe pin is co-located with a via of the via array to provide electrical contact with a ball pad of the ball grid array. The probe array is mounted in a probe block and the probe block and printed circuit board include alignment holes and alignment pins for aligning the probe array with the vias and a probe attachment to secure the probe block to the ball grid array technology circuit assembly.

4 Claims, 5 Drawing Sheets

METHOD AND APPARATUS FOR TESTING OF BALL GRID ARRAY CIRCUITRY

FIELD OF THE INVENTION

The present invention relates to a method and apparatus for testing integrated circuit packages and, in particular, the in situ testing of ball grid array integrated circuits.

BACKGROUND OF THE INVENTION

While integrated circuit fabrication technology has advanced to allow the fabrication of integrated circuits containing progressively larger numbers of circuit elements and more complex circuits in a given package, the increased density of circuits in a package has resulted in problems in heat dissipation, high speed signal integrity and space for signal input/output connections. Large scale integrated circuits, for example, have traditionally provided input/output pins around the circumference of the package to provide power to the circuits therein and to connect signals into and out of the circuits. The pins in turn are connected, typically by soldering, to pads or lands on a circuit board, which is often multi-layered to provide a greater number of signal leads and connections to the pins of the integrated circuit package. Limitations on the minimum size and spacing of the input/output pins, and of the pads and leads of the circuit board, however, limit the number of available input/output connections to the circuits in the package. As a result, it is often difficult to provide a sufficient number of input/output connections just for the required power and input/output signals, and it is even more difficult, or impossible, to provide a sufficient number of input/output connections for desirable test/debugging signals.

Ball Grid Array (BGA) technology provides a solution to many of these problems in integrated circuit packing by providing significantly improved thermal dissipation, increased package input/output pin counts and improved high speed signal integrity. BGA packaging does not use input/output pins located around the periphery of the package for signal and power input/output connections, but instead provides a grid array of connection points on the "bottom" of the package, that is, the side of the package against the circuit board the package is mounted on, that contact a corresponding grid array of pads or lands on the circuit board. Electrical connections between the grid array of contact points on the package and the pads of the circuit board are made by means of "balls" of solder on the package contact point, resulting in the term "ball grid array". It will be apparent that by using a significant portion of the surface area of the bottom face of the package for a grid array of input/output connections, BGA technology thereby allows a significantly increased number of package input/output connections for signal and power connections and for in-circuit connections for testing and debugging of the circuitry.

BGA technology, however, results in a further problem in that a BGA package does not have accessible package pins to which pin clips or substitution clips may be connected to perform testing and debugging operations. While some test connections may be made by means of traces to the pads of the printed circuit board that a BGA package is mounted onto, it is not possible as a practical matter to provide a sufficient number of test pads on the printed circuit board because of space limitations in routing traces to and from the pads. That is, it is necessary to maintain required minimum widths of and spacings between the pads and leads or traces of the circuit board so that, as discussed in the following description of the invention, the number of traces that may be routed between the pads, and in particular to and from the pads in the inner regions of the grid array of contact points, is limited. This problem is not relieved but is in fact compounded by the use of multi-layer circuit boards to provide space for additional traces on the inner and bottom layers of the circuit because the routing of traces from one layer to another requires the use of vias, that is, conductive paths between the layers. As a consequence, each via requires space on each layer of the circuit board that the via penetrates, in the same manner as a pad, thereby reducing the space available for traces on the printed circuit board in the same manner as illustrated in FIG. 1A. The problem is further compounded in multi-layer circuit boards of the prior art because, as illustrated in FIG. 1B, each via is routed through a via pad on each layer the via penetrates and each via pad is connected directly only to the via. As such, each via must be connected to, for example, a pad, by means of an additional trace between the via pad and the pad, thereby occupying even more space on the circuit board. As a result, the ability to perform in-circuit testing and debugging in both the research and development phase and in the production of circuits packaged using BGA technology is severely limited.

Other problems of the BGA technology of the prior art also include, for example, the requirement to provide and carefully control the standoff height between a BGA package and the printed circuit board the package is mounted onto in order to insure the formation of solder "balls" of the correct size and shape. Yet another problem of the BGA technology of the prior art is that it is difficult to correct or resolder a faulty connection between a BGA package and the circuit board it is mounted on as the "balls" forming the electrical connections are not accessible. It is thereby necessary to remove the BGA package from the circuit board and completely resolder the BGA package to the circuit board in order to correct a faulty joint, with a consequent high risk of damage to either or both of the BGA package or the printed circuit board.

The present invention provides a solution to these and other problems of the prior art.

SUMMARY OF THE INVENTION

The present invention is directed to an improved ball grid technology circuit assembly providing enhanced connections between the circuits within a ball grid array circuit package and, for example, test probe connections for testing and debugging of the ball grid array circuits. The ball grid array circuit package contains integrated circuits and includes, on a mounting face of the ball grid array circuit package, a ball grid array of ball pads forming electrical connections to the integrated circuits in the ball grid array circuit package. The circuit package further includes a printed circuit board for mounting the ball grid array circuit package and providing electrical connections to the ball pads of the ball grid array circuit package wherein the ball grid array circuit package is mounted to the printed circuit board with the mounting face of the ball grid array circuit package mating with an upper face of the printed circuit board.

According to the present invention, the printed circuit board further includes a via array of vias wherein each via extends from the upper face of the printed circuit board to a lower face of the printed circuit board, each via corresponds to and is co-located with a ball pad of the ball grid array, and each via contacts the corresponding ball pad of the ball grid array to provide a conductive path between the corresponding ball pad and the lower end of the via at the lower face of the printed circuit board to provide electrical access to the corresponding ball pad of the ball grid array of the ball grid array circuit package.

In a presently preferred embodiment of the invention, the vias have diameters less than or equal to 0.010 inch. In addition, standoffs may be located between the mounting face of the ball grid array circuit package and the upper face of the printed circuit board and, in some embodiments, the standoffs may be comprised of circuit components. The printed circuit board may further include at least two alignment holes extending through the printed circuit board and located adjacent the ball grid array circuit package for receiving corresponding alignment pins of a probe array and aligning the probe array to make contact with the lower ends of the vias on the lower face of the printed circuit board. The probe array in turn includes a pin array of probe pins to provide electrical contact with the lower ends of the vias wherein each probe pin corresponds to and is co-located with a via of the via array to provide electrical contact with a ball pad of the ball grid array through the corresponding via of the via array.

In this respect, the present invention further includes a probe array for providing electrical contact with the ball pads of a ball grid array circuit package of a ball grid technology circuit assembly. In this aspect of the present invention, the ball grid array circuit assembly and the probe array include, in the ball grid array circuit assembly, a ball grid array circuit package containing integrated circuits and having, on a mounting face of the ball grid array circuit package, a ball grid array of ball pads forming electrical connections to the integrated circuits in the ball grid array circuit package. A printed circuit board is used for mounting the ball grid array circuit package and providing electrical connections to the ball pads of the ball grid array circuit package wherein the ball grid array circuit package is mounted to the printed circuit board with the mounting face of the ball grid array circuit package mating with an upper face of the printed circuit board. As described, the printed circuit board includes a via array of vias wherein each via extends from the upper face of the printed circuit board to a lower face of the printed circuit board, each via corresponds to and is co-located with a ball pad of the ball grid array, and each via contacts the corresponding ball pad of the ball grid array to provide a conductive path between the corresponding ball pad and the lower end of the via at the lower face of the printed circuit board to provide electrical access to the corresponding ball pad of the ball grid array of the a ball grid array circuit package. The probe array, in turn, includes a probe block containing the pin array of probe pins to provide electrical contact with the lower ends of the vias wherein each probe pin corresponds to and is co-located with a via of the via array to provide electrical contact with a ball pad of the ball grid array through the corresponding via of the via array. A probe attachment mechanism may be provided and includes a support frame enclosing the ball grid array circuit package, at least two shaft shaped fasteners mounted to the probe block adjacent to the pin array and extending through corresponding attachment openings through the printed circuit board to engage with the support frame to align the probe pins of the pin array with the vias of the via array and to secure the probe block to the ball grid array technology circuit assembly to make electrical contact between the probe pins and the lower ends of the corresponding vias on the lower face of the printed circuit board, and at least two alignment pins extending through corresponding alignment openings in the printed circuit board adjacent the ball grid array circuit package for aligning the probe pins of the probe array and the vias of the via array.

DESCRIPTION OF THE DRAWINGS

The foregoing and other objects, features and advantages of the present invention will be apparent from the following description of the invention and embodiments thereof, as illustrated in the accompanying figures, wherein.

DETAILED DESCRIPTION OF THE INVENTION

A. Introductory Description of Ball Grid Array Circuit Assemblies and Discussion of the Prior Art (FIGS. 1 and 2A–2D)

The present invention will be best understood by first considering the conventional construction and mounting of a ball grid array circuit package of the prior art and the problems arising from the conventional construction and mounting of a ball grid array circuit package according to the prior art.

Figure 1:
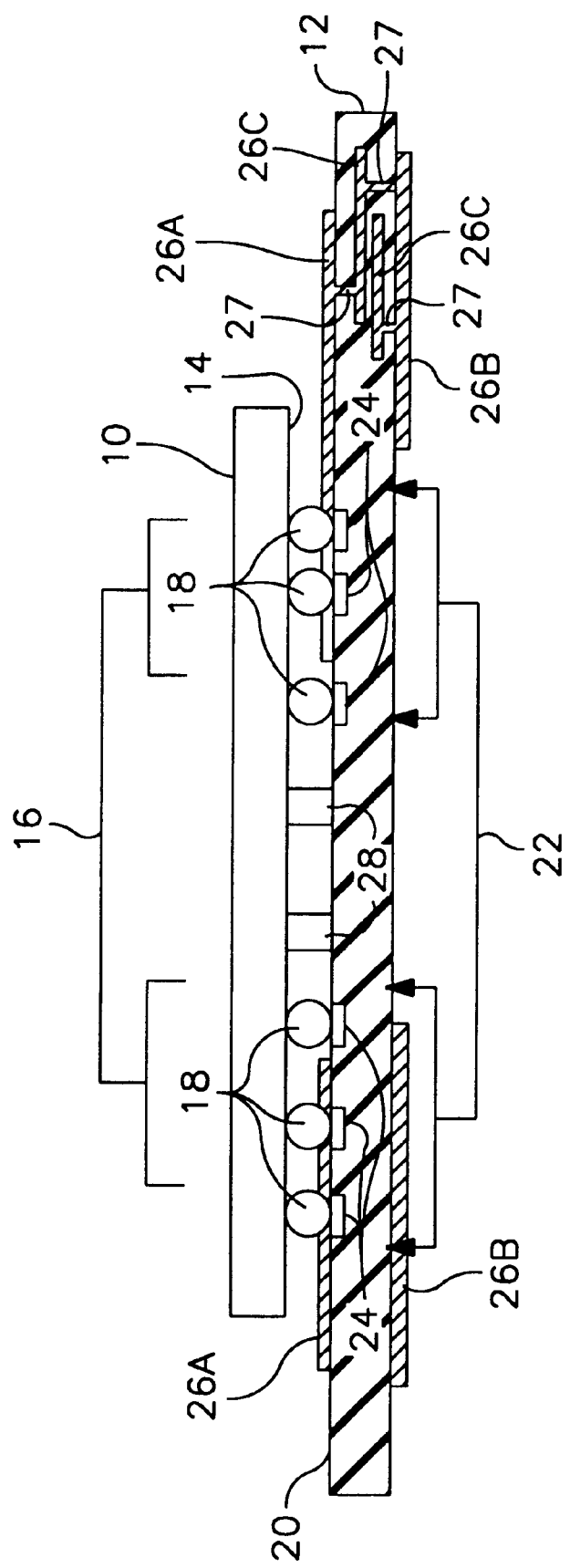
FIG. 1 is diagrammatic representation of a ball grid array circuit assembly of the prior art.

Referring to FIG. 1, a Ball Grid Array Circuit Assembly (BGA Assembly) 2 is typically comprised of a BGA Package (BGA) 10 containing one or more integrated circuits that is mounted to a Printed Circuit Board (PCB) 12 that may, for example, be a motherboard or a sub-assembly printed circuit board that is in turn mounted to a motherboard, and that provides leads, traces, circuits, connectors, or other components connecting to the circuitry in the BGA 10. As illustrated, a lower Mounting Face 14 of the BGA 10 includes a Ball Grid Array 16 of Ball Pads (Balls) 18 making electrical connection with the circuitry within BGA 10. PCB Upper Face (PCB UFace) 20 of PCB 12, in turn, includes a corresponding Pad Array 22 of Pads 24 wherein the configuration and dimensions of Page Array 22 and the location of each of Pads 24 in Pad Array 22 is selected such that each Pad 24 will correspond to and make contact with a corresponding one of Balls 18 of Ball Grid Array 16. PCB 12, in turn, is typically a multi-layer circuit board of any of the types well known to those of ordinary skill in the relevant arts and will typically be provided with conductive paths, referred to as traces, to connect Pads 24 with the circuits, leads, connectors, and so on that provide or receive power and input/output signals to or from BGA 10 through PCB 12. The traces in a multi-layer PCB 12, which will hereafter be referred to generally as Traces 26 unless it is necessary to refer to and identify specific traces, will typically include Traces 26A on PCB UFace 20 and may include Traces 26B and 26C located, respectively, on the lower face of PCB 12 and on the inner layers of PCB 12. If a PCB 12 includes Traces 26 on two or more layers or faces of the PCB 12, the Traces 26 located on different layers of the PCB 12 will typically be interconnected through inter-layer conductive paths, indicated as Vias 27, which are typically comprised of conductively plated holes extending between and interconnecting corresponding via pads on different layers with each via pads in turn being connected to one or more traces on the layer on which the via pad is located. It will be noted with respect to FIG. 1A and other figures discussed below that the circuits, leads, connectors and other elements that are external to BGA 10 and PCB 12 and that connect to the BGA 10 through, for example, Traces 26, are not shown explicitly for clarity of illustration of the present invention and because the use and implementation of such circuits, leads, connectors and other elements is well known in the art.

In a typical implementation, and for example, Balls 18 may have diameters in the range of 0.020 to 0.035 inch while Pads 24 may have a width or diameter in the range of 0.0187 to 0.025 inch and Balls 18 and Pads 24 may each be spaced apart by a distance in the range of 0.040 to 0.050 inch. Traces 26, in turn and for example, may be provided with pads having a width on the order of 0.020 to 0.030 inch on signal lines routed at 0.003 to 0.006 inch space/trace which, as described, severely limits the providing of contact points for in-circuit debugging and test. It should also be noted that while the term "ball" is commonly accepted and used in the industry to refer to the elements identified herein as Balls 18, the actual physical shape of such "balls" is generally hemispherical or dome-like, having a greater or lesser degree of roundness or flatness in cross section, or possibly having a shape intermediate between a "ball" and a hemisphere.

Figure 2A:
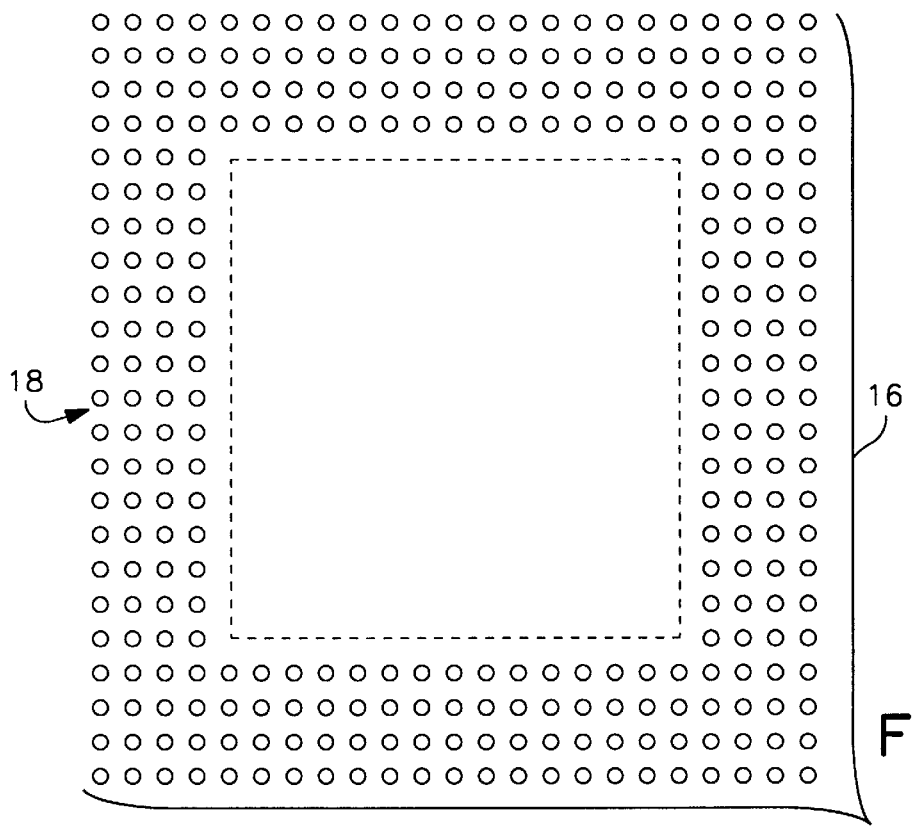
FIGS. 2A and 2B are diagrammatic representations of possible configurations of ball grid arrays.
Figure 2B:
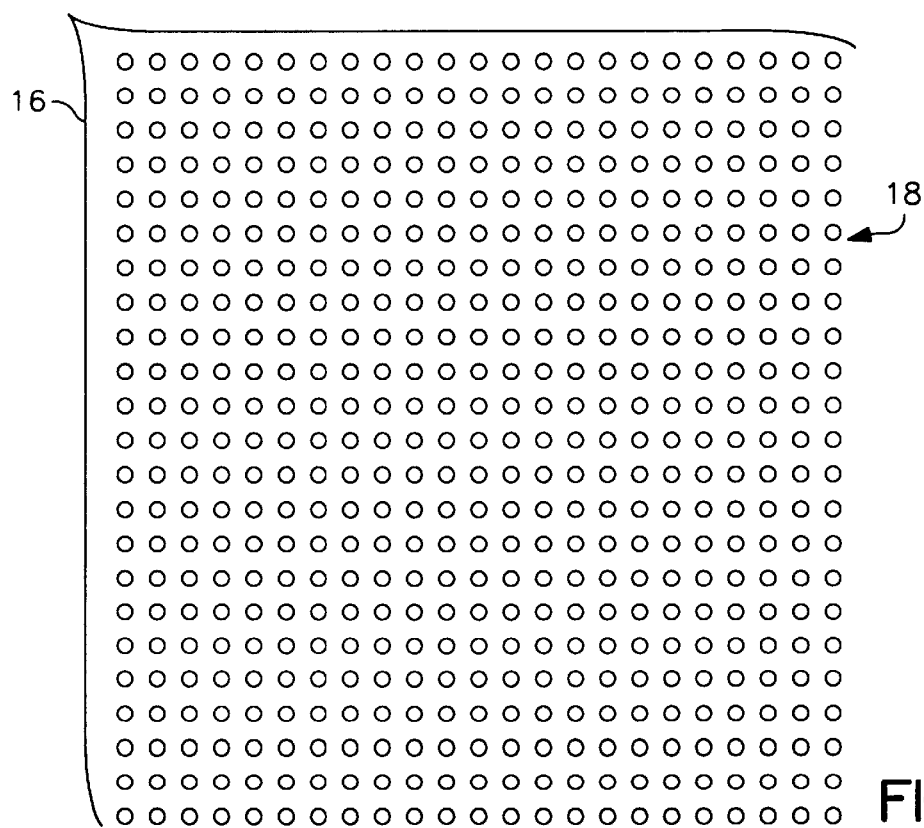

The grid array of Balls 18 and the matching grid array of Pads 24 may assume a variety of configurations, depending upon the configuration of the circuitry contained in the BGA 10, the number and locations of the signal and power connections and traces to the BGA 10 circuitry, and whether other components are mounted to PCB 12 within the area of BGA 10, that is, between BGA 10 and PCB 12. As indicated in FIG. 1, for example, certain spaces within the area of BGA 10 may be occupied by stand-off spacers or supports, indicated as Spacers 28, which may serve as soldering standoffs or to allow reflow soldering of the units, or other forms of mount or support for BGA 10. Spacers 28 are often comprised of elastomeric material as providing less mounting stresses than does a rigid material, or may be comprised of circuit components of suitable dimensions, thereby advantageously utilizing the space within the perimeter of the BGA 10 that is not occupied by Balls 18. Two examples of possible configurations of Ball Grid Array 16 and the matching Pad Array 22 are illustrated in FIGS. 2A and 2B wherein that shown in FIG. 2A provides space within the area of BGA 10 to mount components, spacers or supports beneath the BGA 10. The example shown in FIG. 2B occupies the major portion of the area under the BGA 10 and illustrates the greatly increased number of contacts to the circuitry of a BGA 10 that may be provided relative to the number of contacts available in packaging techniques using conventional contact pins. It will be noted that while the grid arrays are typically symmetric to, for example, evenly distribute mounting stresses on BGA 10 while providing an optimum separation between Balls 18 and allowing the maximum number of Balls 18 within the area to be occupied by the grid array. The grid arrays may be non-symmetric, however, depending upon the configuration of the circuitry contained in the BGA 10, the number and locations of the connections to the BGA 10 circuitry, and whether other components are mounted within the area of BGA 10, and spacers or mounts may be used to provide support for the BGA 10.

Figure 2C:
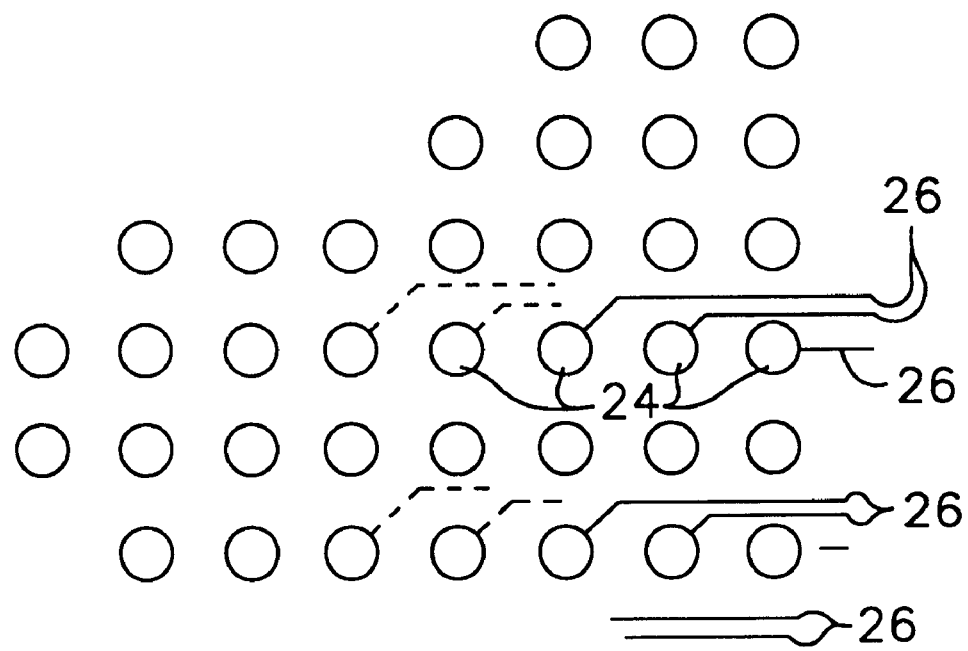
FIG. 2C is an illustration of the routing of traces in a portion of a grid array of pads or lands on a circuit board of the prior art.
Figure 2D:
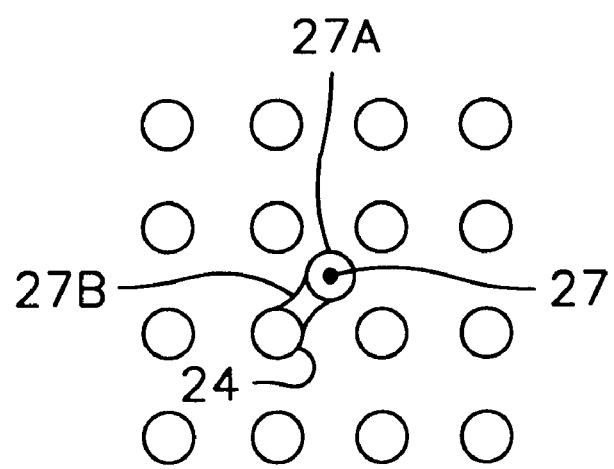
FIG. 2D is an illustration of the method for constructing vias between layers of a multi-layer circuit board of the prior art.

Lastly, it has been described above with respect to the problems of the methods of the prior art for constructing BGA assemblies that it is not possible as a practical matter to provide a sufficient number of Traces 26 on a PCB 12 to allow thorough testing and debugging of a BGA circuit because of space limitations in routing the Traces 26 to and from Pads 24. That is, it is necessary to maintain required minimum widths of and spacings between the pads and leads or traces of the circuit board so that, as illustrated in FIG. 2C, the number of Traces 26 that may be routed between Pads 24, and in particular to and from the pads in the inner regions of the grid array of Pads 24, is limited. In the example illustrated in FIG. 2C, for example, only two Traces 26 may be routed between Pads 24. Traces 26 connecting to Pads 24 located within Pad Array 22 therefore must frequently be routed to a different layer of PCB 12 to gain access to areas outside of Pad Array 22, as represented by the Traces 26 indicated by dashed lines in FIG. 2C. As also described, however, this problem is compounded by the use of multi-layer circuit boards to provide space for additional traces on the inner and bottom layers of the circuit because the routing of traces from one layer to another requires the use of Vias 27, that is, conductive paths between the layers. As a consequence, each Via 27 requires space on each layer of the circuit board that the Via 27 penetrates, in the same manner as a Pad 24, thereby reducing the space available for Traces 26 on the lower and inner layers of the printed circuit board in the same manner as illustrated in FIG. 2C. The problem is further compounded in multi-layer circuit boards of the prior art because, as illustrated in FIG. 2D, each Via 27 is routed through a Via Pad 27A on each layer the Via 27 penetrates and each Via Pad 27A is connected to, for example, a Pad 24 or a Trace 27, by means of an additional Via Trace 27B between the Via Pad 27A and, for example, the Pad 24, making a "dogbone pattern" and thereby occupying even more space on the circuit board. As a result, the ability to perform in-circuit testing and debugging in both the research and development phase and in the production of circuits packaged using BGA technology is severely limited.

B. Description of the Present Invention (FIGS. 3 and 4)

Figure 3:
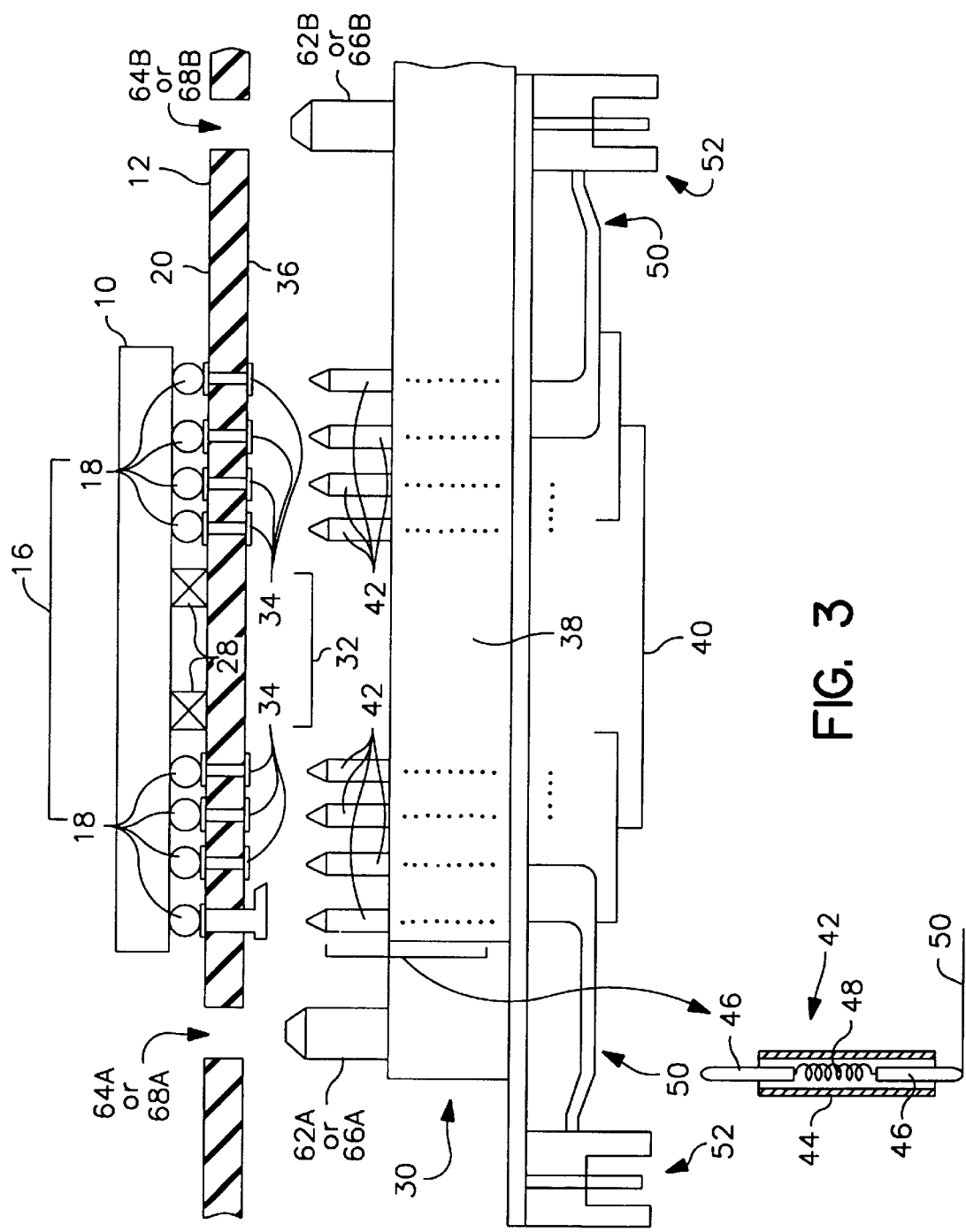
FIG. 3 is an isometric view of a ball grid array technology circuit assembly of the present invention and a probe array of the present invention; and, FIG. 4 is a side view of a ball grid array technology circuit assembly of the present invention and a probe array of the present invention.
Figure 4:
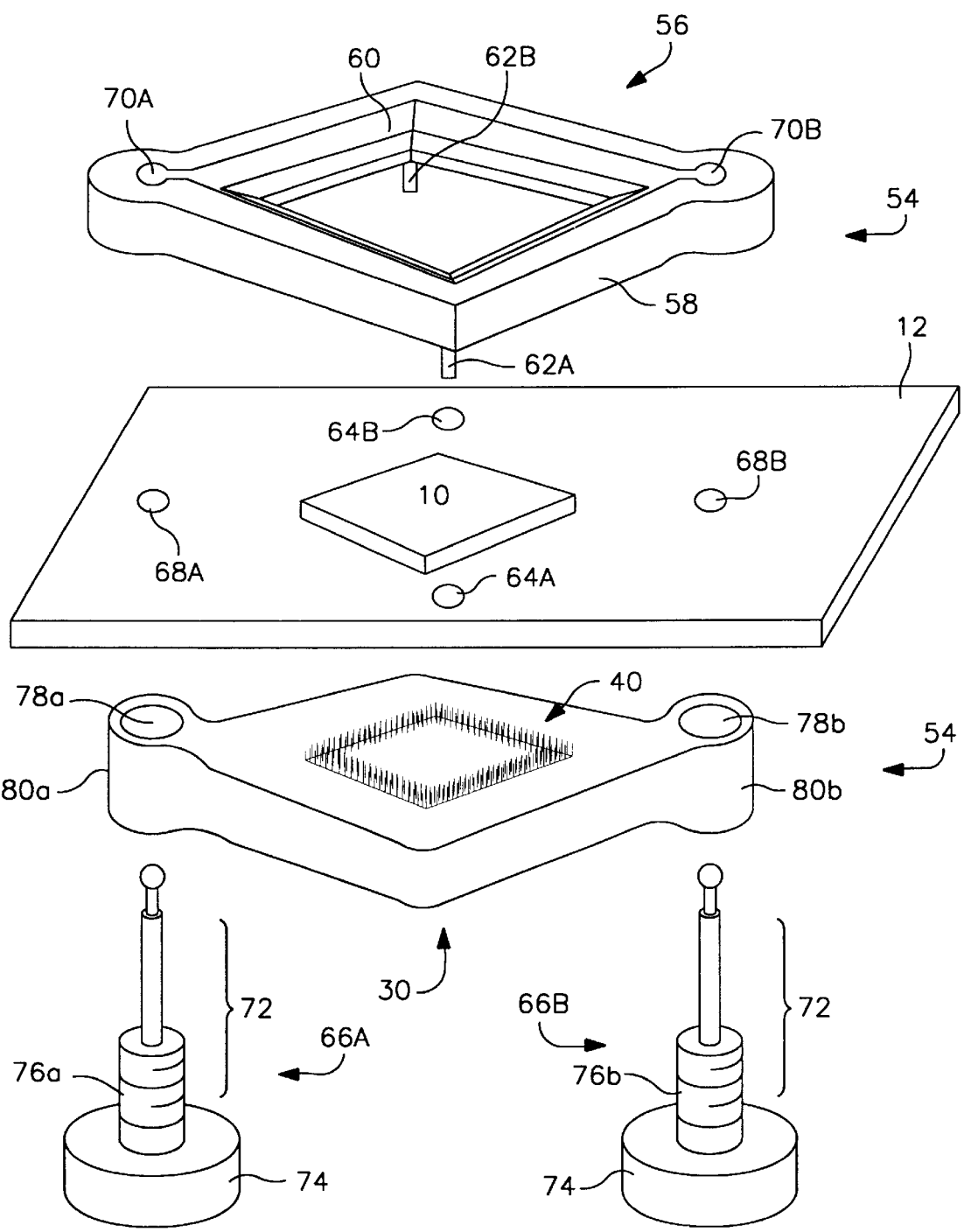

Referring now to FIGS. 3 and 4, therein are respectively shown an isometric view and a side view of the present invention for a Ball Grid Technology Circuit Assembly (BGA Assembly) 2 allowing a BGA Probe Array (Probe Array) 30 to connect to a BGA 10 mounted on a PCB 12 to provide input/output connections for in-circuit testing and debugging of the circuits in the BGA 10, such as during circuit development or production or in a field environment. As illustrated therein, and according to the present invention, a PCB 12 is modified by the replacement of Pad Array 22 of Pads 24 by a Via Array 32 of Vias 34 wherein each Via 34 extends from PCB Upper Face (PCB UFace) 20 to PCB Lower Face (PCB LFace) 36 and corresponds to and is co-located with a Ball 18 of Ball Grid Array 16. Each Via 34 thereby provides electrical access to a corresponding Ball 18 on PCB LFace 36 for testing and debugging purposes by providing an electrical connection between the corresponding Ball 18 of Ball Grid Array 16 and the lower end of the Via 34 on PCB LFace 36.

The dimensions and configuration of Via Array 32 and the locations of Vias 34 in Via Array 32 are selected to correspond to the possible locations of Balls 18 on Mounting Face 14 so that each Via 34 will correspond to and contact a corresponding one of Balls 18 of Ball Grid Array 16. The number of Vias 34 in Via Array 32 and locations of Vias 34 in Via Array 32 will depend upon the number and location of Balls 18 to which contact is desired for purposes of testing and debugging of the circuitry in BGA 10. In the case of PCBs 12 used during the design and development of BGAs 10 or for production testing and debugging of BGAs 10, for example, Via Array 32 may include a Via 34 at each possible location in Via Array 32, so that the Via Array 32 would have a configuration similar to that illustrated in FIG. 2B. This configuration of Vias 34 and Via Array 32 would thereby allow maximum flexibility in selecting test and debugging points in a BGA 10 circuit, and would allow the PCB 12 to be used with different BGAs 10 having different configurations and locations of Balls 18 in Ball Grid Arrays 16. Other PCBs 12, such as the production circuit boards used in final products and with specific BGAs 10, may include Vias 34 only at those locations in Via Array 32 that correspond and connect to the Balls 18 of Ball Grid Array 16 that connect to the points in the circuitry of a BGA 10 that have been selected for test and debugging points.

In a typical implementation, and for example, Vias 34 by have diameters in the range of 0.005 inch to 0.012 inch, but may have larger or smaller diameters, and will be of a length extending from PCB UFace 20 to PCB LFace 36. In a present implementation, Vias 34 are formed by suitable openings or holes through PCB 12 wherein the via holes are lined or filled with conductive material, for example, by plating or vapor deposition using any of the methods known and understood in the art. The via holes may also be filled by filling the via openings through the PCB 12 with solder, again using any of the methods known and understood in the art, such as flow soldering.

With regard to the above, it must be noted that the shape and size of Balls 18 has been found to be critical in establishing satisfactory electrical connections between the circuits of a BGA 10 and the Traces 26 of a PCB 12. It has also been found with regard to the methods of the prior art, wherein Pads 24 provide the electrical contacts between Balls 18 and Traces 26, that the standoff height of the BGA 10 above Pads 24 is critical in controlling the shape and size of Balls 18 and a standoff height of approximately 0.020 inches is presently preferred in the prior art. As such, it is necessary when using the methods of the prior art to use Spacers 28, or components serving as Spacers 28, to provide and control the standoff height of the BGA 10 above the PCB 12.

It has been found that in the method of the present invention, however, wherein the electrical connections are through Vias 34, the size and shape of Balls 18 may be controlled by controlling the amount of solder paste applied between the BGA 10 and the PCB 12 and the diameters of Vias 34. That is, it has been found that proportion between the amount of solder that is drawn into the Via 34 holes and the amount of solder that remains on the surface of the PCB 12 to form Balls 18 is dependent upon the amount of solder paste applied to PCB 12 and the diameters of the Via 34 holes. In the presently preferred embodiment of the invention, it has been found that if the diameters of the Via 34 holes is equal to or less than 0.010 inch, and if the amount of solder paste is controlled proportionally, the Via 34 holes will be filled with solder and sufficient solder will be left on the upper surface of PCB 12 to form well shaped and sized Balls 18. In addition, it has been found that this result is independent of the BGA 10 standoff height, so that Spacers 28 or the equivalent in the form of components are not required in this implementation of the present invention. It has been found, however, that if the amount of solder paste is increased beyond that necessary to fill the Via 34 holes and form the Balls 18, or if the diameters of the Via 34 holes is increased beyond the presently preferred size, the amount of solder that is drawn into the Via 34 holes increases so that Balls 18 are not well formed.

It will be understood that the provision of Vias 34 extending from PCB UFace 20 to PCB LFace 36 will require appropriate routing of Traces 26, both on PCB UFace 20 and PCB LFace 36 and within the inner layers of PCB 12 when PCB 12 is a multilayer circuit board to connect with or to avoid Vias 34, depending upon the intended connections of each Trace 26. It has been found, however, that the existence of Vias 34 has had little impact upon the routing of Traces 26, both on the faces of PCB 12 and within PCB 12, and that a routing of Traces 26 with a spacing between elements of 0.005 inch and 0.050 via spacing provides a satisfactory practical implementation of PCB 12. It should be noted, in this respect, that the existence of each Via 34 on each layer of a multi-layer PCB 12 allows connections to be made to Vias 34 at each layer, thereby facilitating the interconnection of circuits, or traces, on the layers of PCB 12 and to BGA 10 on PCB LFace 36. This, in turn, often allows a reduction in the number of required layers in PCB 12 to achieve the necessary signal and power connections to and from the BGA 10.

It should also be noted that one problem that occurs with the use of BGAs 10 and conventional PCBs 12 using Pad Arrays 22 for connecting Traces 26 to the Balls 18 of Ball Grid Array 16, such as described with respect to FIG. 1 C, is the failure to achieve a satisfactory electrical connection between a Pad 20 and the corresponding Ball 18. When conventional PCBs 12 not having Vias 34 are used, the repair of such single joint failures usually requires that the BGA 10 be removed, that is, unsoldered, from the PCB 12 and resoldered to the PCB 12, with the consequent risks of damage to the BGA 10 or PCB 12 and still further failures to achieve satisfactory connections at one or more Ball 18/Pad 20 connections. The provision of Vias 34, however, allows the repair or rework of individual Ball 18/Pad 20 joints by wicking solder from the PCB LFace 36 of the corresponding Via 36 and through the Via 36 to the faulty joint between the Pad 20 and the Ball 18, thereby eliminating the need to remove BGA 10 from PCB 12 and reducing the risk of damage to the BGA 10 or PCB 12 and of further failed Ball 18/Pad 20 connections.

Referring now to BGA Probe Array (Probe Array) 30 in FIGS. 3 and 4, as shown therein a Probe Array 30 is comprised of a Probe Block 38 having a Pin Array 40 of spring loaded Probe Pins 42. As illustrated diagrammatically in FIG. 5, each Probe Pin 42 is typically comprised of a hollow, cylindrical conductive Probe Body 44 containing opposed Contact Pins 46 that slide longitudinally within the Probe Body 44 to make contact with, for example, a Via 34, and a Spring 48 located between Contact Pins 46 that exerts a resilient spring force on the Contact Pins 46 along the longitudinal axis of the Probe Body 44 to force a Contact Pins 46 into contact with a Via 34 and, for example, a Lead 50 as described below. As represented diagramatically in FIGS. 3, 4 and 5, Probe Array 30 includes a Lead 50 for and corresponding to each Probe Pin 42 so that each Probe Pin 42 may be connected to, for example, test and debugging equipment of various types. Leads 50 may, for example, be comprised of Traces 26 or provided by traces on rigid printed circuit boards or constructed of multi-lead flexible printed circuits, flat wiring cables or individual leads. Leads 50 may be brought out from Probe Pins 42 to Connectors 52 mounted on Probe Block 38 for connection to test and debugging equipment or may be formed into cables leading directly to connectors on the test and debugging equipment, or Probe Block 38 may be mounted to a printed circuit board or sandwiched between two printed circuit boards and Leads 50 provided by traces on the circuit board or boards.

Finally with respect to PCB 12 and the test connections provided to Balls 18 through Vias 34, it will be understood that Traces 26 of the PCB 12 of the present invention, and in particular the Traces 26 connecting to Vias 34, may be driven by tri-state drivers mounted, for example, on PCB 12, thereby facilitating the testing and debugging of BGA 10 and any associated circuitry connected to BGA 10 through PCB 12. It will also be understood that Leads 50 connecting to Probe Pins 42 may likewise provided with tri-state drivers, for example, as part of the test and debugging equipment connected to the BGA 10 through Probe Array 30, to further facilitate the testing and debugging of the BGA 10 and associated circuitry.

Next considering Probe Array 30, as illustrated in FIGS. 3 and 4 the configuration and dimensions of Pin Array 40 and the locations of Probe Pins 42 in the Pin Array 40 are again selected to correspond to the number, dimensions and locations of Vias 34 in Via Array 32 and thereby to the number, dimensions and locations of Balls 18 in Ball Grid Array 16. As described above, the dimensions of Pin Array 40 and the number and locations of Probe Pins 42 in Pin Array 40 will depend upon the number and location of Vias 34 in Via Array 32 to which contact is desired for purposes of testing and debugging of the circuitry in BGA 10. A Probe Array 30 for general use, such as during the design and development of BGAs 10, for production testing and debugging of BGAs 10, or for testing and debugging of a variety of BGAs 10 and PCBs 12 in the field, may include a Probe Pin 42 at each possible location in Pin Array 40, so that Probe Array 30 would have a configuration similar to that illustrated in FIG. 2B. This configuration of Probe Array 30 would thereby allow maximum flexibility in selecting test and debugging points in a BGA 10 circuit, and would allow the Probe Array 30 to be used with a variety of different BGAs 10 having different configurations and locations of Balls 18 in Ball Grid Arrays 16, so long as the dimensions of the Ball Grid Arrays 16 and Via Arrays 32 corresponded to those of the Probe Array 30. Other Probe Arrays 30, such as those designed for use with specific BGAs 10, may include Probe Pins 42 only at those locations corresponding to Vias 34 in Via Arrays 32 that correspond and connect to the points in the circuitry of a BGA 10 that have been selected for test and debugging points. It should be noted that both Probe Arrays 30 having a range of dimensions and numbers and configurations of Probe Pins 42 and individual Probe Pins 42 are commercially available, for example, from Richi-Densha of Japan. As such, a Probe Array 30 may be purchased or designed and constructed for any desired dimensions and configuration of Via Array 32, or for any desired number and configuration of Probe Pins 42 in a Probe Array 30. At present, a typical Probe Array 30 having, for example, a configuration similar to that shown in FIG. 2B, may have a Pin Array 40 having dimensions in the range of 1 inch by 1 inch to 3 inches by 3 inches, or any dimensions in this range, and may contain, for example, 200 to more than 2000 Probe Pins 42, each of which has a diameter of 0.010 to 0.015 inch and a length of 0.100 to 0.250 inch with the Probe Pins 42 being spaced apart on 0.040 to 0.050 inch centers.

As also illustrated diagramatically in FIGS. 3 and 4, Probe Array 30 is further provided with an Attachment Mechanism 54 for aligning Pin Array 40 with Via Array 32 so that each Probe Pin 42 comes into contact with the correct corresponding Via 34 and for attaching Probe Array 30 to BGA Assembly 2, that is, PCB 12 and BGA, 10 to maintain contact between Probe Pins 42 and Vias 34. In the presently preferred embodiment, Attachment Mechanism 54 includes a Locator 56 comprised of a generally rectangular hollow Frame 58 having a Lip 60 extending inwards from the inner side of Frame 58 wherein Frame 58 and Lip 60 that are dimensioned and proportioned to fit over and enclose BGA 10. When Locator 56 is fitted over BGA 10, Frame 58 closely enclosed or contacts PCB 12 around the periphery of BGA 10, thereby supporting and stiffening PCB 12, and Lip 60 closely encloses or contacts the top edge of BGA 10 around the periphery of BGA 10, further supporting and stiffening BGA 10.

As shown, in the presently preferred embodiment Frame 58 is further provided with two or more Alignment Pins 62a and 62b which are generally located in the regions adjacent to diagonally opposite corners of Frame 58 and, as described below, of Probe Block 38. Alignment Pins 62a and 62b extend from Frame 58 and mate into corresponding Alignment Holes 64a and 64b in PCB 12 to orient and attach Frame 58 to PCB 12. In some embodiments, Alignment Pins 62a and 62b may also extend through PCB 12 to mate with corresponding Alignment Holes 66a and 66b in Probe Array 30, to assist in aligning Probe Pins 42 of Pin Array 40 with the corresponding Vias 34 when Frame 58 and Probe Array 30 are mounted onto PCB 12. Alignment Pins 62a and 62b may be separate parts mounted onto or into Frame 58 or may be a part of Frame 58 and may extend directly from Frame 58 or may extend from corresponding outward extensions of Frame 58. It will be noted that Alignment Pins 62a and 62b and corresponding Alignment Holes 64a and 64b are located so as not to interfere with either BGA 10 or Traces 26 and, in the present embodiment, are generally located within 1 inch of BGA 10. It will also be noted that Alignment Pins 62a and 62b and corresponding Alignment Holes 64a and 64b may be arranged asymmetrically in spacing or orientation with respect to BGA 10 or may be of different dimensions or cross sectional shapes, so that Frame 58 can mount over BGA 10 and to PCB 12 in only one orientation.

As also shown in FIGS. 3 and 4, Attachment Mechanism 54 further includes Fasteners 66a and 66b mounted to Probe Array 30 wherein Fasteners 66a and 66b extend from Probe Array 30 and through corresponding Attachment Holes 68a and 68b in PCB 12 to engage with corresponding Connectors 70a and 70b mounted to Frame 58 to attach Frame 58 and Probe Block 38 into position on PCB 12 so that Probe Pins 42 engage Vias 34. As in the case of Alignment Pins 62a and 62b, Fasteners 66a and 66b and the corresponding Connectors 70a and 70b and are generally located in the regions adjacent to the diagonally opposite corners of Probe Block 38 that are not occupied by Alignment Pins 62a and 62b. Again as in the case of Alignment Pins 62a and 62b, Fasteners 66a and 66b, Attachment Holes 68a and 68b and Connectors 70a and 70b are located so as not to interfere with either BGA 10 or Traces 26 and, in the present embodiment, are generally located within 1 inch of BGA 10. Fasteners 66a and 66b, Attachment Holes 68a and 68b and Connectors 70a and 70b may, like Alignment Pins 62a and 62b, be arranged asymmetrically in spacing or orientation with respect to BGA 10, so that Probe Block 38 can be mounted to PCB 12 in only one orientation, thereby assuring the correct alignment and orientation of Probe Pins 42 with Vias 34. with.

In the presently preferred embodiment illustrated in FIGS. 3 and 4, Fasteners 66a and 66b are comprised of a generally shaft shaped body, indicated generally as Shafts 72, having tightening Knobs 74 located at one end and with Threaded Sections 76a and 76b that pass through and engage with corresponding Threaded Openings 78a and 78b of Probe Block 38, thereby mounting Fasteners 66a and 66b to Probe Block 38. Threaded Openings 78a and 78b may be formed in Probe Block 38, or as illustrated in FIGS. 3 and 4 may be formed in Extensions 80a and 80b of Probe Block 38. The upper ends of Shafts 72 of Fasteners 66a and 66b are, in turn, shaped to engage Connectors 70a and 70b to connect Frame 58 and Probe Block 38 to PCB 12 and BGA 10 so that Probe Pins 42 engage Vias 34 with the correct alignment and orientation and with sufficient force for good electrical contacts without excessively stressing PCB 12 and BGA 10. In the present embodiment, for example, Connectors 70a and 70b are spring loaded capture cups mounted in Extensions 80a and 80b of Frame 58, so that Frame 58 and Probe Array 30 are mounted to PCB 12 and BGA 10, and Probe Pins 42 forced into contact with Vias 34, with a resilient spring force as well as the mechanical force provided by the engagement of Threaded Sections 76a and 76b with Threaded Openings 78a and 78b.

It will be understood with respect to the above description of Attachment Mechanism 54 that there are many possible variations from the embodiment described just above that will meet the same mechanical and electrical requirements for attaching Probe Array 30 into mechanical and electrical engagement with PCB 12 and BGA 10. For example, Alignment Pins 62a and 62b may be mounted on Probe Block 38 rather than on Frame 58, the positions of Fasteners 66a and 66b on Probe Block 38 and of Connectors 70a and 70b on Frame 58 may be reversed, and so on in any possible combination, either or both of Alignment Pins 62a and 62b and Fasteners 66a and 66b may be arranged asymmetrically to orient Probe Array 42 to Vias 34, different forms of Connectors 70a and 70b may be used, such as captured nuts or threaded openings through Frame 58, and so on. In yet other implementations, such as a hand-held Probe Array 30 for field or experimental laboratory use or a mechanically actuated Probe Array 30 used in an automatic testing device, such as used in a production line, Attachment Mechanism 54 may include only one or more pairs of Alignment Pins 62 and the functions of Fasteners 66 will be performed by a user's hand or by a mechanical actuator. It will also be appreciated that different forms of Pin Array 40 and Probe Pins 42 or their equivalents, such as solderable BGA sockets, may be used, or Pin Array 40 and Probe Pins 42 may be implemented, for example, by pads and traces on a flexible printed circuit board having, for example, a resilient backing to allow the pad array functioning as Pin Array 40 to conform to the array of ball pads on the BGA 10. It will also be understood that the dimensions of PCBs 12, BGAs 10, Probe Arrays 42, Vias 34 and Traces 26 may vary widely, as may the numbers and configurations of Balls 18, Ball Grid Arrays 16, Pads 24, Pad Arrays 22, Vias 34, Via Arrays 32, Probe Pins 42 and Probe Arrays 42.

It will therefore be apparent to those of ordinary skill in the relevant arts that while the invention has been particularly shown and described herein with reference to preferred embodiments of the apparatus and methods thereof, various changes, variations and modifications in form, details and implementation may be made therein without departing from the spirit and scope of the invention as defined by the appended claims, certain of which have been described herein above. It is therefore the object of the appended claims to cover all such variation and modifications of the invention as come within the true spirit and scope of the invention.

What is claimed is:
1. A ball grid technology circuit assembly, comprising:
   a ball grid array circuit package containing integrated circuits and having on a mounting face of the ball grid array circuit package a ball grid array of ball pads forming electrical connections to the integrated circuits in the ball grid array circuit package,
   a printed circuit board for mounting the ball grid array circuit package and providing electrical connections to the ball pads of the ball grid array circuit package,
   the ball grid array circuit package being mounted to the printed circuit board with the mounting face of the ball grid array circuit package mating with an upper face of the printed circuit board, and
   the printed circuit board including a via array of vias wherein
   each via extends from the upper face of the printed circuit board to a lower face of the printed circuit board,
   each via corresponds to and is co-located with a ball pad of the ball grid array, and
   each via contacts the corresponding ball pad of the ball grid array to provide a conductive path between the corresponding ball pad and the lower end of the via at the lower face of the printed circuit board to provide electrical access to the corresponding ball pad of the ball grid array of the a ball grid array circuit package,
   the ball grid technology circuit assembly providing an increased number of test connections to the integrated circuits of the ball grid array circuit package.
2. A probe array for providing electrical contact with the ball pads of a ball grid array circuit package of a ball grid technology circuit assembly, the ball grid array circuit assembly and the probe array comprising:
   in the ball grid array circuit assembly,
   a ball grid array circuit package containing integrated circuits and having on a mounting face of the ball grid array circuit package a ball grid array of ball pads forming electrical connections to the integrated circuits in the ball grid array circuit package,
   a printed circuit board for mounting the ball grid array circuit package and providing electrical connections to the ball pads of the ball grid array circuit package,
   the ball grid array circuit package being mounted to the printed circuit board with the mounting face of the ball grid array circuit package mating with an upper face of the printed circuit board, and
   the printed circuit board including a via array of vias wherein
   each via extends from the upper face of the printed circuit board to a lower face of the printed circuit board,
   each via corresponds to and is co-located with a ball pad of the ball grid array, and
   each via contacts the corresponding ball pad of the ball grid array to provide a conductive path between the corresponding ball pad and the lower end of the via at the lower face of the printed circuit board to provide electrical access to the corresponding ball pad of the ball grid array of the a ball grid array circuit package, and
   in the probe array,
   a probe block containing the pin array of probe pins to provide electrical contact with the lower ends of the vias wherein each probe pin corresponds to and is co-located with a via of the via array to provide electrical contact with a ball pad of the ball grid array through the corresponding via of the via array, and a probe attachment mechanism, including a support frame enclosing the ball grid array circuit package, at least two shaft shaped fasteners mounted to the probe block adjacent to the pin array and extending through corresponding attachment openings through the printed circuit board to engage with the support frame to align the probe pins of the pin array with the vias of the via array and to secure the probe block to the ball grid array technology circuit assembly to make electrical contact between the probe pins and the lower ends of the corresponding vias on the lower face of the printed circuit board, and at least two alignment pins extending through corresponding alignment openings in the printed circuit board adjacent the ball grid array circuit package for aligning the probe pins of the probe array and the vias of the via array, the ball grid technology circuit assembly providing an increased number of test connections to the integrated circuits of the ball grid array circuit package.

3. A method for mounting a ball grid circuit package into a ball grid technology circuit assembly and providing electrical access to ball pads of the ball grid circuit package wherein the ball grid array circuit package contains integrated circuits and, on a mounting face of the ball grid array circuit package, a ball grid array of ball pads forming electrical connections to the integrated circuits in the ball grid array circuit package, comprising the steps of:

providing a printed circuit board for mounting the ball grid array circuit package and providing electrical connections to the ball pads of the ball grid array circuit package, and mounting the ball grid array circuit package to the printed circuit board with the mounting face of the ball grid array circuit package mating with an upper face of the printed circuit board, wherein the printed circuit board includes a via array of vias wherein each via extends from the upper face of the printed circuit board to a lower face of the printed circuit board, each via corresponds to and is co-located with a ball pad of the ball grid array, and each via contacts the corresponding ball pad of the ball grid array to provide a conductive path between the corresponding ball pad and the lower end of the via at the lower face of the printed circuit board to provide electrical access to the corresponding ball pad of the ball grid array of the a ball grid array circuit package, thereby providing an increased number of test connections to the integrated circuit of the ball grid array circuit package.

4. A method for providing electrical contact with ball pads of a ball grid array circuit package of a ball grid technology circuit assembly wherein the ball grid array circuit package contains integrated circuits and, on a mounting face of the ball grid array circuit package, a ball grid array of ball pads forming electrical connections to the integrated circuits in the ball grid array circuit package, comprising the steps of:

forming a ball grid array circuit assembly by mounting the ball grid array circuit package to a printed circuit board for mounting the ball grid array circuit package and providing electrical connections to the ball pads of the ball grid array circuit package, wherein the ball grid array circuit package is mounted to the printed circuit board with the mounting face of the ball grid array circuit package mating with an upper face of the printed circuit board, and the printed circuit board includes a via array of vias wherein each via extends from the upper face of the printed circuit board to a lower face of the printed circuit board, each via corresponds to and is co-located with a ball pad of the ball grid array, and each via contacts the corresponding ball pad of the ball grid array to provide a conductive path between the corresponding ball pad and the lower end of the via at the lower face of the printed circuit board to provide electrical access to the corresponding ball pad of the ball grid array of the a ball grid array circuit package, and mounting a probe array to the printed circuit board, wherein the probe array includes a probe block containing a pin array of probe pins to provide electrical contact with the lower ends of the vias wherein each probe pin corresponds to and is co-located with a via of the via array to provide electrical contact with a ball pad of the ball grid array through the corresponding via of the via array, and a probe attachment mechanism, including a support frame enclosing the ball grid array circuit package, at least two shaft shaped fasteners mounted to the probe block adjacent to the pin array and extending through corresponding attachment openings through the printed circuit board to engage with the support frame to align the probe pins of the pin array with the vias of the via array and to secure the probe block to the ball grid array technology circuit assembly to make electrical contact between the probe pins and the lower ends of the corresponding vias on the lower face of the printed circuit board, and at least two alignment pins extending through corresponding alignment openings in the printed circuit board adjacent the ball grid array circuit package for aligning the probe pins of the probe array and the vias of the via array, there providing an increased number of test connections to the integrated circuits of the ball grid array circuit package.

* * * * *